United States Patent [19]

Sone

[11] Patent Number: 4,506,166
[45] Date of Patent: Mar. 19, 1985

[54] PULSE GENERATION CIRCUIT USING AT LEAST ONE JOSEPHSON JUNCTION DEVICE

[75] Inventor: Junichi Sone, Tokyo, Japan

[73] Assignee: Nippon Electric Co., Ltd., Tokyo, Japan

[21] Appl. No.: 381,653

[22] Filed: May 24, 1982

[30] Foreign Application Priority Data

May 25, 1981 [JP] Japan .......................... 56-78966

[51] Int. Cl.$^3$ .......................... H03K 3/38; H03K 5/04
[52] U.S. Cl. .................................. 307/277; 307/266; 307/306
[58] Field of Search ............... 307/273, 277, 306, 266; 357/5; 365/162

[56] References Cited

U.S. PATENT DOCUMENTS 3,953,749  4/1976  Baechtold et al. ............... 307/277
4,401,900  8/1983  Faris ................................. 307/277

OTHER PUBLICATIONS

E. P. Harris, "Single-Device Superconducting Flip-Flop", IBM Technical Disclosure Bulletin, vol. 20, No. 11B, Apr. 1978, pp. 4979-4980.

Primary Examiner—John Zazworsky
Attorney, Agent, or Firm—Sughrue, Mion, Zinn, Macpeak and Seas

[57] ABSTRACT

A pulse generator utilizes a Josephson junction gate circuit having first and second control current paths for conducting control currents in opposite directions. An input signal applied to one of the control current paths will transform the Josephson junction device to the voltage state resulting in the leading edge of a pulse output from a branch circuit connected in parallel with the gate current path of the Josephson junction device, and the same input pulse passed through a delay circuit will be applied in the opposite direction to the other control current path to thereby switch the Josephson junction device back to the zero voltage state and cause the trailing edge of the pulse output. The delay device can be a $\pi$ circuit, a single additional Josephson junction device having its control current path connected either in series or in parallel with the one control current path of the first Josephson junction device, or a plurality of cascaded Josephson junction devices.

9 Claims, 13 Drawing Figures

FIG. 5(a)
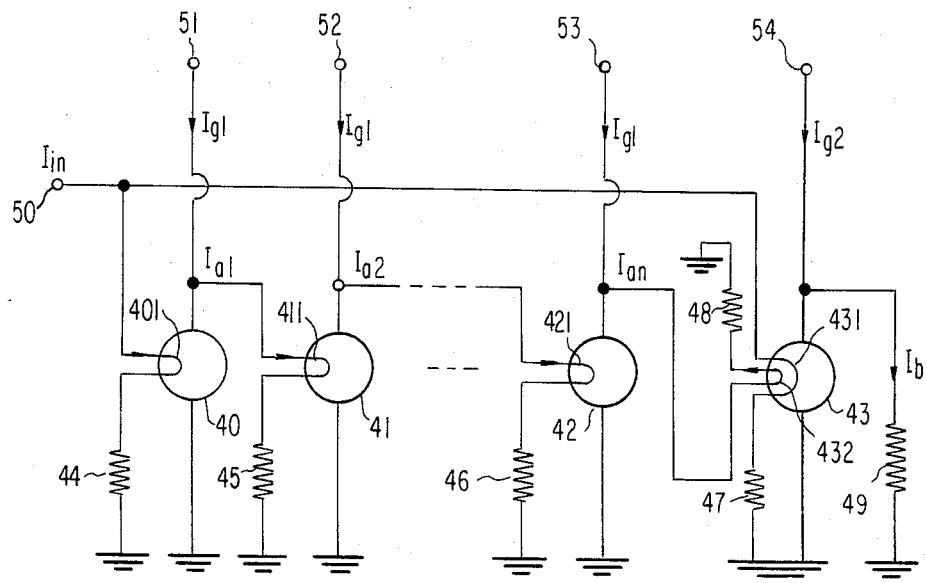
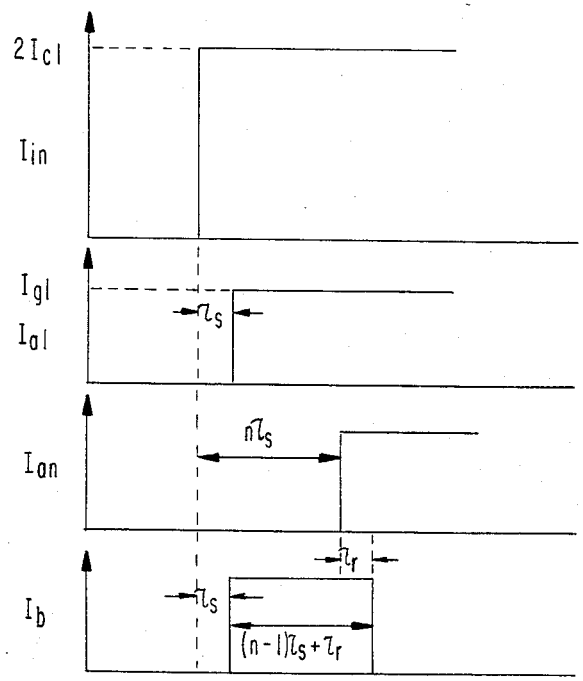
FIG. 5(b)

PULSE GENERATION CIRCUIT USING AT LEAST ONE JOSEPHSON JUNCTION DEVICE

BACKGROUND OF THE INVENTION

The present invention relates to a pulse generation circuit using at least one Josephson junction device and, more particularly, to a pulse generation circuit which can generate an extremely short duration pulse whose duration can be selected as desired, and has a simple circuit arrangement suitable for integration.

Josephson junction devices operable at very low temperatures around the temperature of liquid helium (He) are far superior to conventional semiconductor devices developed on a silicon or GaAs substrate in the aspects of low power consumption and high speed switching operation. Therefore, it would be possible to build a computer by making use of Josephson junction devices as its switching elements or memory elements. For such a high speed computer, it is necessary that circuits such as a memory circuit, a logic circuit and a control circuit be operated with a short access time or a short cycle time, and a timing pulse for fast and accurate operations of the circuits should have short rise and fall times and a short duration.

Difficulty is experienced, however, in attaining such a timing pulse by means of a semiconductor pulse generator under room temperature. If attained, the deterioration of the waveform of the timing pulse is caused by the cable connecting the semiconductor pulse generator with the Josephson junction IC. It is therefore necessary to generate such a timing pulse which is synchronous to a clock current generated by a signal source under room temperature by using the Josephson junction IC.

To meet these requirements, there has been proposed a circuitry in which one gate current path of an interferometer gate circuit is grounded through a Josephson junction and a resistor while a control current path is supplied with an input pulse signal and said one gate current path with a DC gate current. See the paper entitled "A Josephson Ultrahigh-Resolution Sampling System", David B. Tuckerman, Appl. Phys. Lett. 36(12), June 15, 1980, pp. 1008–1010. In the proposed circuitry, a gate current is fed to the Josephson junction when the gate circuit is transferred from the zero-voltage state to the voltage state by supplying an input pulse signal. In the voltage state, the gate current flows through the resistor until the gate current exceeds a threshold current. The flow of the gate current exceeding the threshold current causes the Josephson junction to make a transition to the voltage state and thereby sharply reduces the current flowing through the resistor. Thus, the current flowing through the resistor is picked out as a pulse current. However, since the gate circuit holds its voltage state even when the input pulse is terminated, the next output pulse cannot be produced unless the gate circuit is reset to the zero-voltage state. Therefore, the gate current must be cut off before the supply of each input pulse signal. Non-latching operation of the gate circuit for resetting the gate circuit automatically is impossible because the Josephson junction remains in the voltage state (high resistance state).

A circuit has been proposed by Faris for resetting the gate circuit automatically to the zero-voltage state so as to generate an output pulse in response to each input pulse signal. See the paper entitled "Generation and Measurement of Ultra-Short Current Pulses With Josephson Devices", Sadeg M. Faris, Appl. Phys. Lett. 36(12), June 15, 1980, pp. 1005–1007. This circuit includes a second gate circuit having one of its control current paths connected in series with the control current path of the first gate circuit, the other control current path supplied with a DC bias current and a gate current path connected in parallel with the gate current path of the first gate circuit through a coil. Such circuitry is also not fully acceptable because additional elements such as the second gate circuit and inductor element are needed to reset the gate circuit and the inductor element occupies a substantial chip area which renders the circuitry unsuitable for integration. Furthermore, neither one of the proposed circuit can freely vary the duration of pulses.

SUMMARY OF THE INVENTION

It is an object of the present invention to provide a simple pulse generation circuit using at least one Josephson junction device which can accurately generate an ultrashort-duration pulse every time an input pulse signal is supplied thereto.

It is another object of the present invention to provide a pulse generation circuit using at least one Josephson junction device which can generate a pulse whose duration is as short as the transition time of the Josephson junction from the voltage state to the zero-voltage state.

It is still another object of the present invention to provide a pulse generation circuit using at least one Josephson junction device which can vary the duration of the pulse as desired.

It is a further object of the present invention to provide a pulse generation circuit using at least one Josephson junction device which omits the inductor element for advantageous integration.

In accordance with one feature of the present invention, there is provided a pulse generation circuit comprising a first gate circuit having at least one Josephson junction and including a first control current path, a second control current path connected to an input terminal adapted to be fed with a clock input, and a gate current path connected to a first gate terminal adapted to be fed with a DC current of a predetermined amplitude, a first resistor of a predetermined resistance connected in parallel with the gate current path, the first gate circuit making a transition from a zero-voltage state to a voltage state when a current of a predetermined amplitude flows through the second control current path in a predetermined direction, and a delay means for delaying the clock input by a predetermined period of time and supplying the delayed clock input to the first control current path in the opposite direction to the current flowing through the second control current path. The duration of the resultant pulse can be varied by varying the delay time of the delay means. The delay means may comprise one which uses at least one second gate circuit whose state transfers to the voltage state upon the flow of a clock input through the second gate circuit, and supplies a gate current flowing through the second gate circuit to the control current path of the first gate circuit in order to utilize the switching time of the second gate circuit. Use may also be made of a known delay circuit which employs an inductance element, a capacitance element or a like lumped constant element.

Other objects and features of the present invention will become apparent by reference to the following description taken in conjunction with the accompanying drawings.

BRIEF DESCRIPTION OF THE DRAWINGS

FIGS. 5(a) and 5(b) are a circuit diagram showing still another embodiment of the present invention which is based on the circuit of FIG. 2(a) but arranged to render the pulse duration variable and a timing chart demonstrating an operation of the circuit shown in FIG. 5(a), repectively.

DESCRIPTION OF THE PREFERRED EMBODIMENTS

Figure 1A:
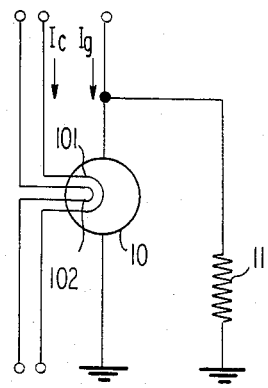
FIG. 1(a) is a symbol showing a Josephson junction device (gate circuit) applicable to the present invention.
Figure 1B:
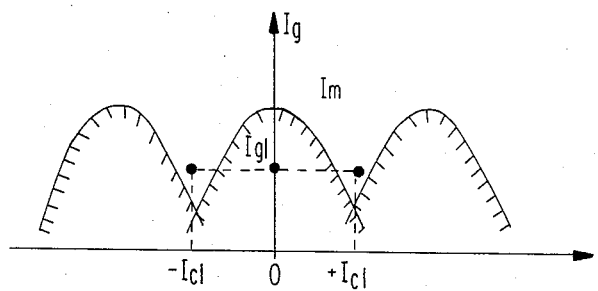
FIGS. 1(b) and 1(c) show curves representing relationships between a threshold value $I_m$ of a gate current $I_g$ of the gate circuit and a control current $I_c$, FIG. 1(b) indicating a symmetric characteristic and FIG. 1(c) an asymmetric characteristic.
Figure 1C:
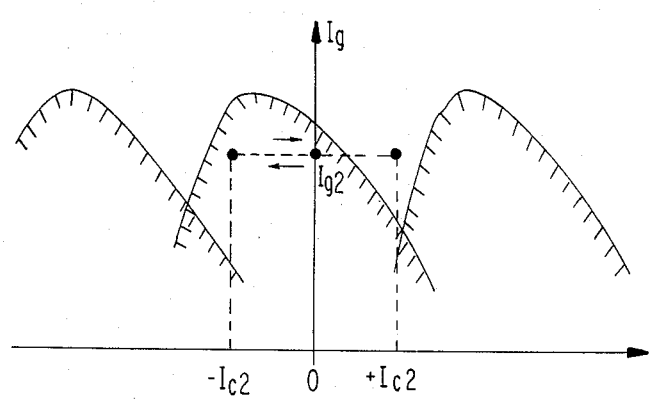

A gate circuit using at least one Josephson junction device is switched to take either the voltage state or the zero-voltage state by controlling a threshold current $I_m$ of a gate current $I_g$ flowing through the gate circuit by a control current $I_c$, which is magnetically coupled with the gate circuit. The gate circuit in the following description will be indicated as shown in FIG. 1(a). The gate circuit designated by the reference numeral 10 has a control current path 101 through which the control current $I_c$ is supplied. Another control current path 102 may be further provided, and the control current $I_c$ may be supplied therethrough rather than through the path 101. The flow of the control current $I_c$ transfers the gate circuit 10 into the voltage state to change the flow of the gate current $I_g$ from the path of the gate circuit 10 to the path of a resistor 11. The threshold current $I_m$ of the gate current $I_g$ as a function of the control current $I_c$ defines the control characteristics. The control characteristics are classified into a symmetric characteristic with respect to the flow direction of the control current $I_c$, as shown in FIG. 1(b) and an asymmetric one, as shown in FIG. 1(c). In FIGS. 1(b) and 1(c), the hatched area inside the characteristic curve represents the zero-voltage state and the rest the voltage state. The asymmetric characteristic curve is attained by an asymmetric structure of the Josephson junction device. In FIG. 1(b) the supply of a control current $\pm I_{c1}$ to the gate circuit upon delivery of a gate current $I_{g1}$ causes the gate circuit to transfer (switch) from the zero-voltage state to the voltage state. On the other hand, in FIG. 1(c), a control current $+I_{c2}$ under the supply of a gate current $I_{g2}$ will transfer the state of the gate circuit from the zero-voltage state to the voltage state, but with a control current $-I_{c2}$ and the same gate current, the gate circuit retains the zero-voltage state. As shown, a similar characteristic curve appears as the absolute value of the control current increases. Where control currents flow through the two control paths 101 and 102 in the same direction or in opposite directions, an additive or subtractive value of these control currents affects the gate current.

Figure 2A:
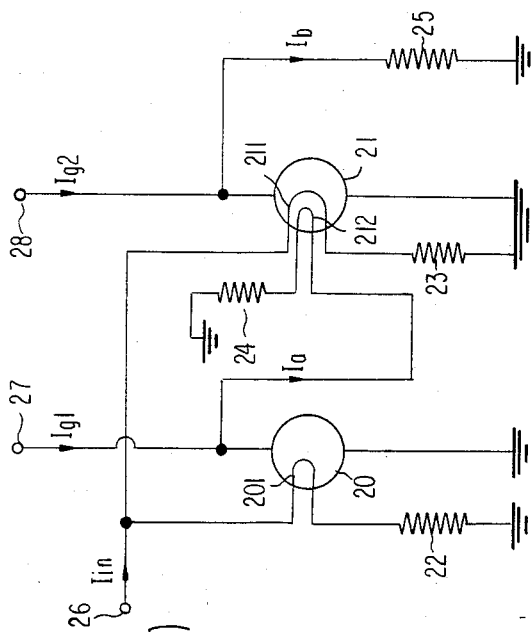
FIGS. 2(a) and 2(b) are a circuit diagram showing one embodiment of the present invention and a timing chart demonstrating an operation of the circuit shown in FIG. 2(a), respectively.

Referring to FIG. 2(a), a pulse generation circuit according to a first embodiment of the present invention comprises a first gate circuit 20 having the symmetric control characteristic such as depicted in FIG. 1(b) and provided with a control current path 201, and a second gate circuit 21 having the asymmetric control characteristic as shown in FIG. 1(c) and provided with two control current paths 211, 212. An input pulse current or clock $I_{in}$ is supplied to an input terminal 26 which is grounded through two different paths, one including the control current path 201 and a resistor 22 and the other including the control current path 211 and a resistor 23. A gate current $I_{g1}$ is fed to a terminal 27 which is connected to one end of the gate current path of the gate circuit 20 the other end of which is grounded, and to the control current path 212 of the gate circuit 21 whose other end is grounded through a resistor 24. Further, a gate current $I_{g2}$ is supplied to a terminal 28 which is connected to one end of the gate current path of the gate circuit 21 the other end of which is grounded, the terminal 28 also being grounded through a resistor 25. The control current paths 211, 212 are connected such that control currents flow therethrough in opposite directions. The resistors 22, 23 have an identical electric resistance. The resistances of the resistors 24, 25 are so selected that the individual gate circuits 20, 21 operate in the known non-latching mode. The gate current $I_{g1}$ corresponds to the gate current $I_{g1}$ in FIG. 1(b) and also has a value equal to $I_{c2}$ in FIG. 1(c), while the input pulse current $I_{in}$ is a pulse whose amplitude is double that of the control current $I_{c1}$. The gate current $I_{g2}$ corresponds to the gate current $I_{g2}$ indicated in FIG. 1(c). In this embodiment, $I_{c1}$ is selected to be equal to $I_{c2}$. All the connection lines mentioned above are constituted by superconductive lines. It is noted here that the connection to ground may be replaced by a connection to a reference potential.

The pulse generation circuit having such a construction will be operated as follows.

Figure 2B:
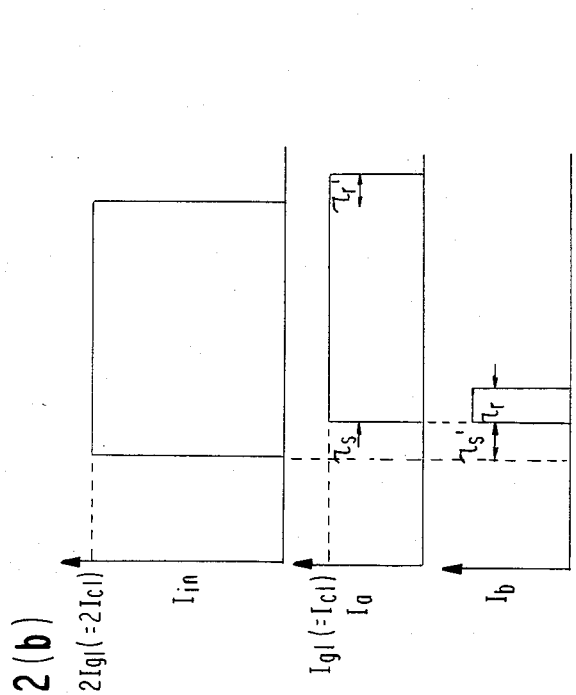

Referring now to FIG. 2(b), the input clock current $I_{in}$ is equally divided by the resistor 22, 23, and each resultant current having an amplitude $I_{c1}$ ($=I_{c2}$) is passed through a respective one of the control current paths 201, 211. Then, each gate circuit 20, 21 transfers from the zero-voltage state to the voltage state so that the gate current $I_g2$ from the terminal 28 is routed to ground via the resistor 25 and the gate current $I_{g1}$ flowing toward ground via the gate current path of the gate 20 is turned to flow through the control current path 212 of the gate circuit 21 and the resistor 24 to ground. In this instance, a current $I_a$ equal to the amplitude of $I_{g1}$ ($=I_{c2}$) starts flowing through the control current path 212 at a predetermined time after passage of the control current through the control current path 211, this predetermined time constituting a transfer (switching) time $\tau_s$ which the gate circuit 20 requires to switch from the zero-voltage state to the voltage state. This period of time will hereinafter be referred to as the "switching time". Since $I_{g1}$ equals $I_{c2}$ which is equal to $I_{c1}$, control currents of the same amplitude flow in opposite directions through the control paths 211 and 212 of the gate circuit 21, and they cancel each other to nullify the effect on the gate current $I_{g2}$ and to turn the gate circuit 21 back to the zero-voltage state, resulting in a current $I_{g2}$ flowing through the gate circuit 21.

The opposite direction control current $I_a$ ($=I_{g1}$) starts flowing in the control current path 212 upon the lapse of the switching time $\tau_s$ after the control current ($I_{in}/2=I_{c1}$) has started flowing through the control current path 211 of the gate circuit 21. Consequently, the current $I_b$ passed through the resistor 25 forms a pulse waveform which rises at the time when the switching time $\tau_s'$ of the gate circuit 21 expires after the initiation of the flow of the control current through the control current path 211, and falls upon the lapse of a resetting time period $\tau_r$ which the gate circuit 21 takes to switch from the voltage state back to the zero-voltage state after the initiation of the flow of the control current $I_a$ through the control current path 212. The period of time $\tau_r$ will be referred to as the "resetting time" hereinafter. The pulse duration obtained at this time is given by $\tau_s+\tau_r-\tau_s'$ and, therefore is, dependent on the resetting time of the gate 21 assuming that the switching times $\tau_s$ and $\tau_{s'}$ of the gates 20 and 21 are identical. This assumption will also be employed for the following embodiments for the simplicity of description. As the input clock current $I_{in}$ is terminated, the control current flowing through the control path 201 becomes zero to turn the gate 20 back to the zero-voltage state. At the same time, the control current through the control path 211 also becomes zero. Due to its asymmetric control characteristic, the gate 21 does not transfer to the voltage state even with the control current ($-I_{c2}$) flowing through the control current path 212, as will also be seen from FIG. 1(c). After the termination of the control current in paths 201 and 211 and after the elapse of the resetting time $\tau_r'$ of the gate 20, the gate current $I_{g1}$ flows through the gate circuit 20 and as a result, the supply of the current $I_a$ ($=I_{g1}$) is terminated. The same procedure will be repeated thereafter in response to the clock current $I_{in}$.

Figure 3A:
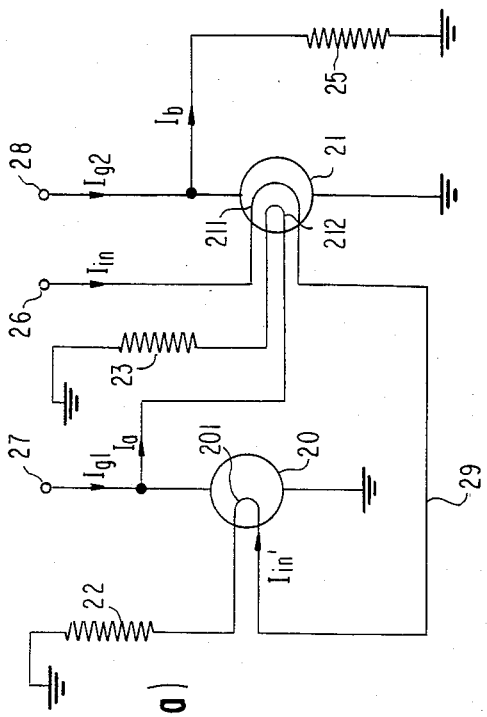
FIGS. 3(a) and 3(b) are a circuit diagram showing another embodiment of the present invention and a timing chart demonstrating an operation of the circuit shown in FIG. 3(a), respectively.

Referring to FIG. 3(a), there is shown another embodiment of the present invention which is essentially similar to the embodiment of FIG. 2(a) with the exception of the clock current $I_{in}$ flowing through the gates 21 and 20 in series rather than in parallel. In more detail, the input terminal 26 for the clock current $I_{in}$ is grounded through the control current path 211 of the gate 21, the control current path 201 of the gate 20 and the resistor 22, while the resistor 24 shown in FIG. 2(a) is omitted. Each part of the construction of FIG. 3(a) functions in the same manner as in FIG. 2(a). The gate currents $I_{g1}$ and $I_{g2}$ in FIG. 3(a) are identical with those of FIG. 2(a), but the clock current $I_{in}$ has the same amplitude as the control current $I_{c1}$.

Figure 3B:
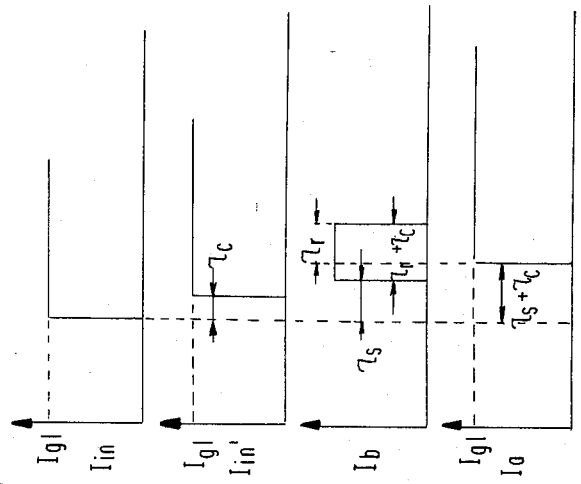

In the circuitry shown in FIG. 3(a), a current $I_{in}'$ starts flowing through the control current path 201 of the gate 20 later than the current $I_{in}$ which is to flow through the control current path 211 of the gate 21, by a period of time $\tau_c$ necessary for the current to propagate through the control current path 211. This time period $\tau_c$ will be called the "crossing delay time" hereinafter. The current $I_a$, therefore, begins to flow through the control current path 212 of the gate 21 later than $I_{in}$ by the time ($\tau_s+\tau_c$), where $\tau_s$ is the switching (setting) time of the gate 20. Consequently, the current $I_b$ through the resistor 25 rises upon the lapse of the setting time $\tau_s'$ of the gate 21 and falls upon the lapse of the resetting time $\tau_r$ of the gate 21 after the flow of the current $I_a$, eventually providing an output pulse width which is ($\tau_r+\tau_c$) assuming $\tau_s$ and $\tau_s'$ are equal. The relative timing between such various currents will be understood from FIG. 3(b). Assuming a relationship $\tau_c << \tau_r$, the pulse duration is substantially $\tau_r$ and is substantially the same as in the case of FIG. 2(a).

Figure 4A:
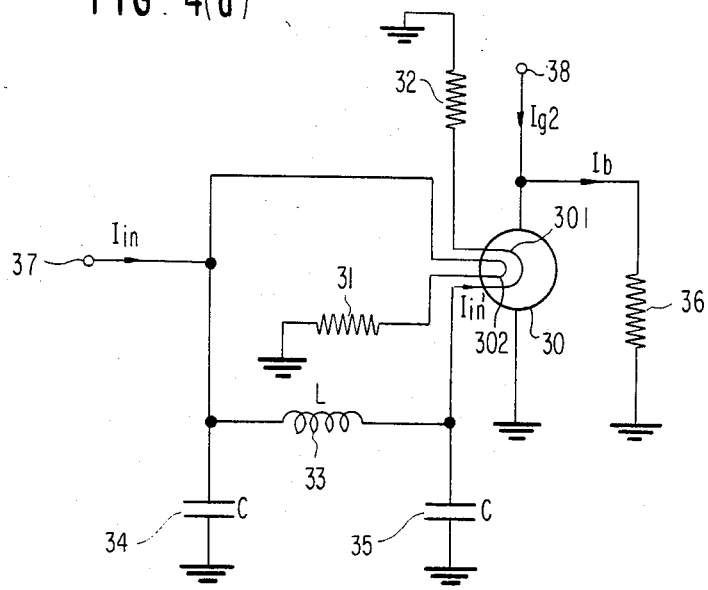
FIGS. 4(a) and 4(b) are a circuit diagram showing another embodiment of the present invention and a timing chart demonstrating an operation of the circuit shown in FIG. 4(a), respectively.

Referring to FIG. 4(a), another embodiment of the present invention which uses a single gate is illustrated. As shown, an input terminal 37 for the clock current $I_{in}$ is grounded via a control current path 302 of a gate 30 having an asymmetric control characteristic, and a resistor 31. The input terminal 37 is also grounded via a delay circuit made up of an inductor 33 of inductance L and capacitors 34, 35, a control current path 301 and a resistor 32. The resistors 31, 32 each have a terminal resistance R while the capacitance C of each capacitor 34, 35 is set at $C=L/2R^2$ for impedance matching.

Figure 4B:
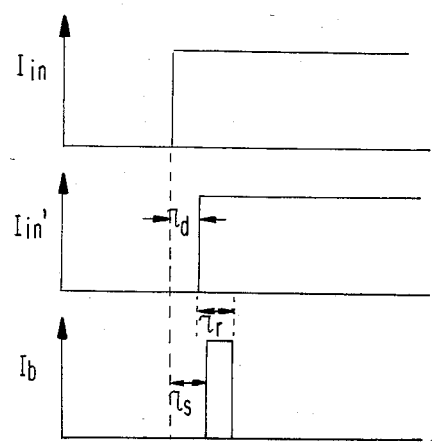

In operation, the current $I_b$ through the resistor 36 rises at a time $\tau_s$ after the clock current $I_{in}$ flows through the control current path 302 to bring the gate 30 into the voltage state, that is, upon the lapse of the switching time $\tau_s$ of the gate 30. The branched clock current $I_{in}$, on the other hand, flows through the control current path 301 after being delayed by $\tau_d$ by the delay circuit constituted by the inductor 33 and capacitors 34, 35. Since the gate 30 thus operates in the same manner as in the foregoing embodiments, the current $I_b$ falls a time $\tau_r$ after the initiation of the flow of the current $I_{in}'$, as shown in FIG. 4(b). The resultant pulse duration is given by ($\tau_r+\tau_d-\tau_s$). The time period $\tau_d$ can be arbitrarily selected and, therefore, the pulse duration is freely selectable. Besides the illustrated construction, the delay circuit may comprise a lumped constant circuit such as a K-type low-pass filter or an inductive m-type low-pass filter or a distributed constant circuit.

Referring to FIG. 5(a), a modified version of the circuit shown in FIG. 2(a) is illustrated which is capable of selecting any desired pulse duration. In FIG. 5(a), "n" gates 40, 41, . . . , 42 are cascaded such that each gate current may be supplied to the control current path of the next stage gate in order that a current may flow through a control current path 432 of a gate 43 whose control characteristic is asymmetric later than a clock current $I_{in}$ which is to flow through a control current path 431. The gates 40, 41, . . . , 42 are similar to the gate 20 included in the circuitry of FIG. 2(a). The gate current paths of the gates 40, 41, . . . , 42 are supplied with DC gate currents $I_{g1}$ from terminals 51, 52, . . . 53, respectively. A control current path 401 of the first stage gate 40 is supplied with a clock current $I_{in}$ ($=2I_{c1}$). As the current $I_{in}$ is fed to the control current path 401, the gate current $I_{g1}$ ($I_{a1}$) is caused to flow through a control current path 411 of the next stage from the terminal 51 after the switching time $\tau_s$ of the gate 40 has expired, whereby the gate 41 makes the transition from the zero-voltage state to the voltage state. The other gates down to the gate 42 are successively transferred to the voltage state in the same manner. Eventually, a current $I_{an}$ which is to flow through the control current path 432 upon transition of the gate 42 to the voltage state appears which rises later than the input $I_{in}$ by a time period $n\tau_s$. As a result, a current $I_b$ through a resistor 49 connected to the gate current path of the gate 43 forms a pulse waveform which rises upon the lapse of the switching time ($\tau_s$) of the gate 43 after the supply of the input $I_{in}$ and falls upon the lapse of the resetting time ($\tau_r$) of the gate 43 after the initiation of the flow of the current $I_{an}$ through the control current path 432. It will readily be understood from the timing chart of FIG. 5(b) that the resultant pulse duration is given by $(n-1)\tau_s + \tau_r$. Resistors 44–47 correspond to the resistors 22, 23 of the circuitry shown in FIG. 2(a) and resistors 48, 49 correspond to the resistors 24, 25.

Figure 6A:
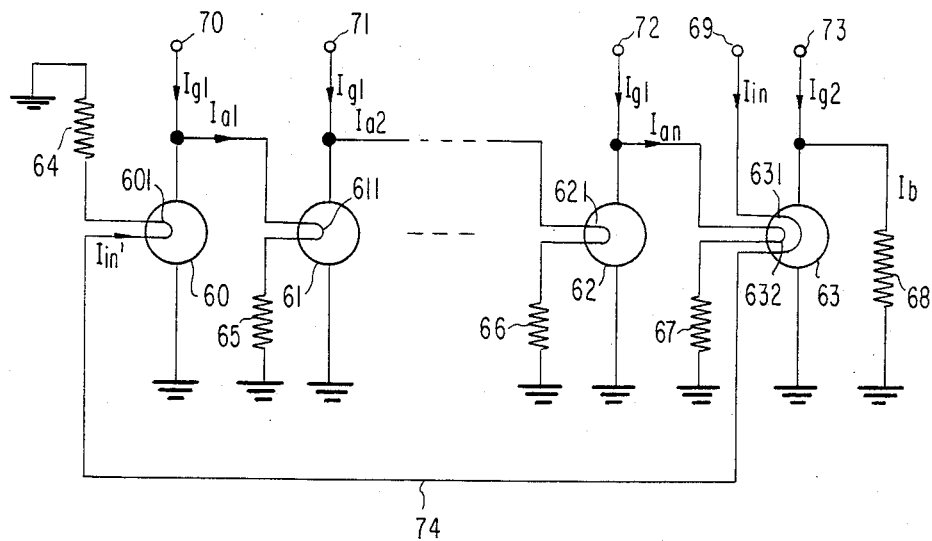
FIGS. 6(a) and 6(b) are a circuit diagram showing a further embodiment of the present invention which is based on the circuit of FIG. 3(a) but also arranged for a variable pulse duration, and a timing chart demonstrating an operation of the circuit shown in FIG. 6(a), respectively.

FIG. 6(a) shows another example of the circuit which permits free selection of a pulse duration and employs the circuitry of FIG. 3(a) as its basic construction. In FIG. 6(a), "n" gates 60, 61, . . . , 62 identical with the gate 20 of FIG. 3(a) are cascaded in order that, as in FIG. 5(a), a current $I_{an}$ may flow through a control current path 632 of a gate 63 whose control characteristic is asymmetric later than a clock current $I_{in}$ by a predetermined period of time. Terminals 70–72 are individually supplied with a DC gate current $I_{g1}$ while a terminal 73 is supplied with a gate current $I_{g2}$. The circuitry includes resistors 64–67, and resistor 68 for the same purpose as the resistors 22, 23 and resistor 25 of FIG. 3(a), respectively.

Figure 6B:
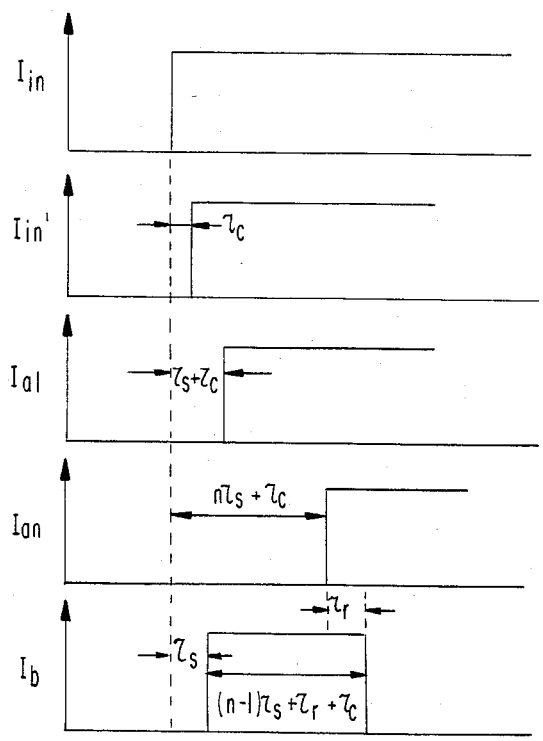

In operation, a clock current $I_{in}$ from a terminal 69 flows to a control current path 601 of the gate 60 through a control current path 631 of the gate 63 and a superconductive line 74 as in the case of FIG. 3(a). Again, this current $I_{in}'$ reaches the control current path 601 delayed relative to the input $I_{in}$ by the crossing time of the control current path 631. The current $I_{in}'$ through the path 601 transfers the gate 60 to the voltage state (after a switching time $\tau_s$) whereupon the current $I_{a1}$ ($I_{g1}$) from the terminal 70 flows through a control current path 611 of the next stage gate 61 to transfer it to the voltage state. The other gates down to the gate 62 are sequentially transferred in the same way to the voltage state. Since the current $I_{an}$ flowing through the control current path 632 of the gate 63 cancels the magnetic effect made by the current $I_{in}$ flowing through the control current path 631, the gate 63 is transferred to the zero-voltage state. Accordingly the current $I_{an}$ flowing through the control current path 632 of the gate 63 is delayed by $(n\tau_s + \tau_c)$. It follows that the current $I_b$ through the resistor 68 has a pulse waveform which rises upon the lapse of the switching time $\tau_s$ of the gate 63 after the rise of the current $I_{in}$ and falls upon the lapse of the resetting time $\tau_r$ of the gate 63 after the rise of the current $I_{an}$. The duration of the resultant pulse signal $I_b$ is $(n-1)\tau_s + \tau_r + \tau_c$. Such a procedure will easily be seen from the timing chart indicated in FIG. 6(b).

It will be noted in FIG. 6(a) that one end of the control current path 631 may be grounded through a resistor identical with the resistor 64 with the clock signal $I_{in}$ supplied from one end of the control current path 601 of the gate 60 (where the resistor 64 is connected), without affecting the operation discussed above with reference to FIG. 6(a). The same applies to the circuitry described in conjunction with FIG. 3(a). The resultant pulse duration will be $(n-1)\tau_s + \tau_r - \tau_c$.

In the illustrated embodiments, a Josephson junction gate of an asymmetric characteristic is used as a primary gate circuit 21, 30, 43, or 63. However, a symmetric characteristic gate can be used instead, provided that the values of two control currents flowing therethrough are so selected that one control current turns the gate to the voltage state while the other control current or the coexistence of the two control currents turns the gate to the zero-voltage state.

What is claimed is:

1. A pulse generation circuit, comprising: a first gate circuit having at least one Josephson junction and including a first control current path, a second control current path connected to an input terminal for receiving a control current in response to a clock input applied to said input terminal, and a gate current path connected to a first gate terminal for receiving therefrom a DC current of a predetermined amplitude said first gate circuit making a transition from a zero-voltage state to a voltage state when a current of a predetermined amplitude flows through said second control current path in a predetermined direction;

a first resistor of predetermined resistance connected in parallel with said gate current path, the resistance of said first resistor being selected so that said first gate circuit operates in a non-latching mode; and delay means for supplying to said first control current path, after a predetermined delay time, an opposite control current flowing in the opposite direction to the current flowing through said second control current path to thereby switch said first gate circuit back to said zero-voltage state.

2. A circuit as claimed in claim 1, further comprising means for deriving a pulse from said first resistor.

3. A circuit as claimed in claim 1, in which said first gate circuit switches to said voltage state after a predetermined transfer time, and said predetermined delay time is substantially equal to said transfer time.

4. A circuit as claimed in claim 1, in which said delay means comprises a second gate circuit including a second resistor and having at least one Josephson junction including a control current path connected in series between said input terminal and said second resistor and a gate current path connected to a second gate terminal for receiving a DC gate signal of a predetermined amplitude, said first control current path being connected to a point between said second gate terminal and said second gate circuit whereby said first circuit receives said opposite control current where said second gate circuit switches to the voltage state, and said second gate circuit switching from a zero-voltage state to a voltage state when a current of a predetermined amplitude flows through its control current path.

5. A circuit as claimed in claim 1, in which said delay means comprises a second gate circuit having at least one Josephson junction and including a control current path connected in series with said second control current path and a gate current path connected to a second gate terminal for receiving a DC gate signal of a predetermined amplitude, said first control current path being connected to a point between said second gate terminal and said second gate circuit whereby said first circuit receives said opposite control current when said second gate circuit switches to the voltage state, and said second gate circuit switching from a zero-voltage state to a voltage state when a current of a predetermined amplitude flows through its control current path.

6. A circuit as claimed in claim 1, in which said delay means comprises a $\pi$ circuit made up of an inductance element and a capacitance element.

7. A circuit as claimed in claim 1, in which said delay means comprises a predetermined number of gate circuits each having a control current path and each having a gate current path connected to a gate terminal for receiving a DC current, said predetermined number of gate circuits including a second gate circuit and (n−1) additional gate circuits, where n is any integer greater than 1, said second gate circuit having its control current path connected in series between said input terminal and said second resistor for receiving a control current in response to said clock input, said predetermined number of gate circuits being cascaded with the control current path of each of said (n−1) additional gate circuits being connected in parallel with the gate current path of a previous gate circuit, and the gate current path of the last of said (n−1) gate circuits being connected in parallel with said first control current path of said first gate circuit.

8. A circuit as claimed in claim 1, in which said delay means comprises a predetermined number of gate circuits each having a control current path and each having a gate current path connected to a gate terminal for receiving a DC current, said predetermined number of gate circuits including a second gate circuit and (n−1) additional gate circuits, where n is any integer greater than 1, said second gate circuit having its control current path connected in series with said second control current path of said first gate circuit, said predetermined number of gate circuits being cascaded with the control current path of each of said (n−1) additional gate circuits being connected in parallel with the gate current path of a previous gate circuit, and the gate current path of the last of said (n−1) additional circuits being connected in parallel with said first control current path of said first gate circuit.

9. A circuit comprising a gate circuit having a Josephson junction device which can take either voltage state or a zero-voltage state, a branch circuit connected in parallel with said gate circuit, means for supplying a current in common to said gate circuit and said branch circuit whereby a gate current flows in said gate circuit when said gate circuit is in said zero-voltage state and flows in said branch circuit when said gate circuit is in said voltage state, first and second control circuits associated with said Josephson junction device, means for supplying an input current to said first control circuit, means for delaying said input current, and means for supplying the output current of said delaying means to said second control circuit, said input current supplied to said first control circuit having an amplitude and a direction in response to which said Josephson junction device assumes said voltage state when said output current is not supplied to said second control circuit, and said output current of said delaying means having an amplitude and a direction in response to which said Josephson junction device assumes said zero-voltage state whether or not said input current is supplied to said first control circuit.

* * * * *

UNITED STATES PATENT AND TRADEMARK OFFICE
CERTIFICATE OF CORRECTION

PATENT NO. : 4,506,166

DATED : March 19, 1985

INVENTOR(S) : Junichi SONE

It is certified that error appears in the above-identified patent and that said Letters Patent is hereby corrected as shown below:

Column 2, line 15, "circuit" should be --circuits--.

Column 5, line 27, "therefore is," should be --therefore, is--.

Signed and Sealed this

Thirteenth Day of August 1985

[SEAL]

Attest:

DONALD J. QUIGG

Attesting Officer    Acting Commissioner of Patents and Trademarks